United States Patent
Solo de Zaldivar et al.

(10) Patent No.: US 7,289,362 B2
(45) Date of Patent: Oct. 30, 2007

(54) ERASABLE AND PROGRAMMABLE NON-VOLATILE CELL

(75) Inventors: Jose Solo de Zaldivar, Waedenswil (CH); Werner Thommen, Zurich (CH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/520,340

(22) PCT Filed: Jun. 25, 2003

(86) PCT No.: PCT/IB03/02807

§ 371 (c)(1),
(2), (4) Date: Jan. 4, 2005

(87) PCT Pub. No.: WO2004/006264

PCT Pub. Date: Jan. 15, 2004

(65) Prior Publication Data

US 2005/0259488 A1     Nov. 24, 2005

(30) Foreign Application Priority Data

Jul. 8, 2002    (EP)    ................... 02015181

(51) Int. Cl.
G11C 11/34    (2006.01)
G11C 16/04    (2006.01)

(52) U.S. Cl. ................... 365/185.05; 365/156; 257/318
(58) Field of Classification Search ........... 365/185.05, 365/156; 257/318
See application file for complete search history.

(56) References Cited

U.S. PATENT DOCUMENTS

| | | | |
|---|---|---|---|
| 5,615,150 A * | 3/1997 | Lin et al. | 365/185.17 |
| 5,646,901 A * | 7/1997 | Sharpe-Geisler et al. | 365/218 |
| 6,088,262 A * | 7/2000 | Nasu | 365/185.04 |
| 6,704,221 B2 * | 3/2004 | Killat | 365/185.01 |
| 2002/0180691 A1 * | 12/2002 | Wong et al. | 345/156 |

FOREIGN PATENT DOCUMENTS

EP    1 306 854    5/2003

* cited by examiner

Primary Examiner—Amir Zarabian
Assistant Examiner—Kretelia Graham

(57) ABSTRACT

An erasable and programmable non-volatile cell, comprising a first transistor having a source, a drain and a gate; a floating capacitor having a floating gate and a control gate, said floating gate being connected to said gate of said first transistor; and means to detect the state, whether erased or programmed, of the cell; is characterized in that said means to detect the state of the cell comprises a second transistor having a source, a drain and a gate, said second transistor being complementary to said first transistor and said gate of said second transistor being connected to said floating gate.

4 Claims, 6 Drawing Sheets

ERASABLE AND PROGRAMMABLE NON-VOLATILE CELL

The invention relates to an erasable and programmable non-volatile cell, comprising a first transistor having a source, a drain and a gate, a floating capacitor having a floating gate and a control gate, said floating gate being connected to said gate of said first transistor, and means to detect the state, whether erased or programmed, of the cell.

Non-volatile storage is required in a wide range of electronic applications, for example to operate microprocessors and controllers. All floating gate structures use the same basic concept to function that charge stored on the floating gate sets the memory transistor to a logical "1" or "0". Depending on whether the memory structure is an enhancement or depletion transistor, when the floating gate is neutral or contains electrons as negative charge, the memory cell will or will not conduct during read. When the floating gate is neutral or has an absence of negative charge, the memory cell will conduct during read. The conducting or non-conducting state is output as the appropriate logical level. "Erasing" means transferring electrons from the floating gate, "programming" means transferring electrons onto the floating gate.

Various erasable and programmable non-volatile cells are known in the art, among them the so-called flash memories, EPROMs, or byte alterable E²PROMs, each of them based on cell structures, such as the stacked gate cell, where normally programming is performed by drain-side or source-side injection of channel hot electrons through an oxide layer under the floating gate.

The injection of electrons into the floating gate produces a shift in the threshold voltage of the transistor which is proportional to the charge injected into the floating gate. This change of threshold voltage is used as a criterion for defining whether the cell is programmed or erased.

The continuous reduction of the supply voltage necessary to achieve low power consumption in battery powered devices requires a design of cells that can be read at very low supply voltages.

In an EPROM cell consisting basically of an n-channel MOS-transistor, the threshold voltage in the erased state, i.e. before programming, normally is in the range of 1.7 to 2.0 V, whereas after programming the threshold voltage increases to 3 to 6 V.

The spread of the threshold voltage in the erased state, however may become very large, in particular when the cell can only be erased by exposure with ultraviolet radiation. This radiation generates hole-electron pairs in the floating gate which neutralize the injected electrons during programming. The efficiency of this process has inherently a large spread which then produces a corresponding spread in the threshold voltage in the erased state. This implies that a certain number of cells in a memory array will show a relative large threshold voltage, and cell operation at low voltage from 1.0 to 1.5 V will not be possible. In this case, even the detection of the state of the cell becomes difficult.

It is the object of the invention to propose an erasable and programmable non-volatile cell which allows to reliably detect the state of the cell.

This object is achieved by a non-volatile cell as defined in claim 1. Preferred embodiments are subject-matter of the subclaims. Specific applications incorporating the inventive erasable and programmable non-volatile cell are given in claims 6 to 8.

According to the invention, said means to detect the state of the cell comprises a second transistor having a source, a drain and a gate, said second transistor being complementary to said first transistor and said gate of said second transistor being connected to said floating gate.

"Complementary" means that the second transistor operates with a different type of channel than the first transistor with respect to the floating gate.

In a preferred embodiment the first transistor which is used as programming device is an n-channel transistor, whereas the second transistor which is used to read the state of the cell is a p-channel transistor. In this case, electrons injected into the floating gate shift the threshold voltage of the cell to more positive values, namely 3 to 6 V for the n-channel transistors and 1 to 3 V for the p-channel transistor. Because a p-channel transistor is used for reading, the natural minimum threshold voltage of the n-channel transistor does not play any role. The read voltage can be set at the bulk voltage of the p-channel transistor.

Still more preferred, the erasable and programmable non-volatile cell is built up with MOS transistors.

It is further proposed to use the polymer-silicon-layer of the MOS transistors also as the floating gate.

Advantageously, the n-well diffusion region is used as said control gate of the floating capacitor.

This solution makes it possible to use EPROM cells in standard CMOS processes for very low read voltages. The preferred embodiment refers to the cell construction with only one polymer layer. The control gate of the cell is neither a second polymer layer nor a metal but the n-well diffusion. This feature is inherently available in any CMOS process.

The invention can advantageously be used in liquid crystal display drivers which are very specific integrated circuits which a large extent of analog design. High accuracy is required in the generation of different voltage levels interacting with the liquid crystal display. Also the oscillator frequency must be calibrated in a range as narrow as possible.

The non-volatile cell according to the invention can further be used in applications operating with low supply voltages of about 1.0 V to 2.5 V needed for portable equipment powered by battery, like mobile phones, calculators, pagers, etc.

Cells according to the invention can also be used for calibration of electrical parameters in an integrated circuit.

The invention will now be described with reference to the accompanying drawings, wherein FIG. 1 illustrates the influence of the spread in threshold voltage when detecting the state of a cell;

FIG. 2 schematically shows a non-volatile cell with complementary transistors;

Figure 1:
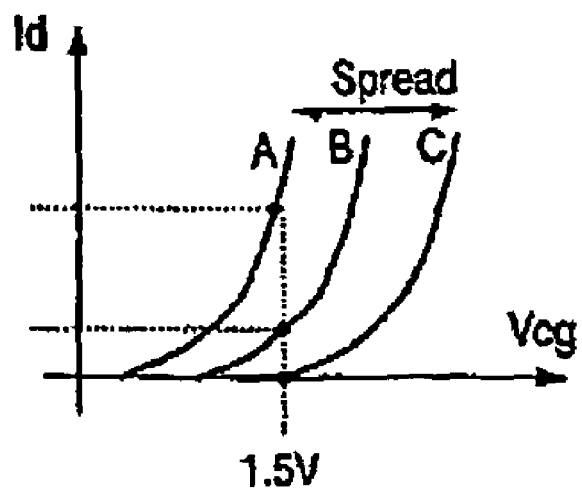

In FIG. 1, the drain current Id of a single n-channel transistor cell is laid off as ordinate, whereas the voltage at the control gate is laid off as abscissa. The characteristics of several cells A, B and C which have a spread in their threshold voltage are shown. At Vcg=1.5 V, cell A will be read as "erased", cells B and C will be detected as "programmed". This fundamental disadvantage is inherent to those cells and is overcome by the invention.

Figure 2:
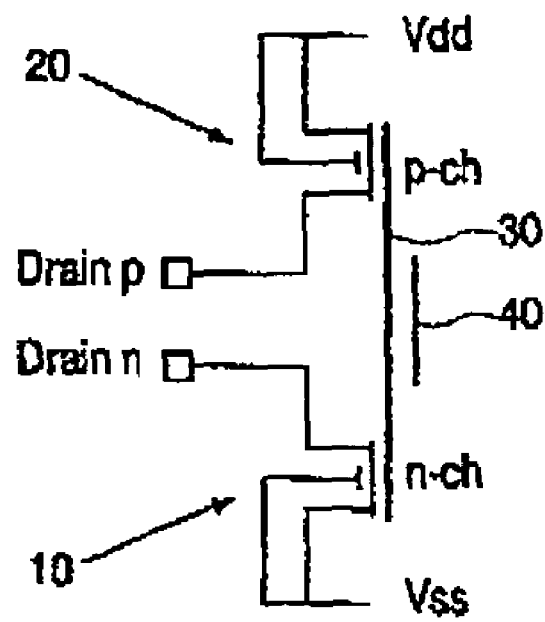

FIG. 2 schematically shows a cell according to the invention consisting of an n-channel transistor 10 and a p-channel transistor 20 having a common floating gate 30 and control gate 40. N-channel transistor 10 is used as a programming device. The programming mechanism is based on the hot electrons phenomena that occurs when the transistor is operated in its saturation region. P-channel transistor 20 is used to read the state of the cell. Electrons injected into the floating gate 30 shift the threshold voltage of the cell to more positive values, namely 3 to 6 V for n-channel transistor 10 and to 1 to 3 V for p-channel transistor 20. Both transistors preferably are MOSFETs. With this configuration, the drain currents of each transistor at erased and programmed states are separated to be unambiguously distinguished from one another.

Figure 3:
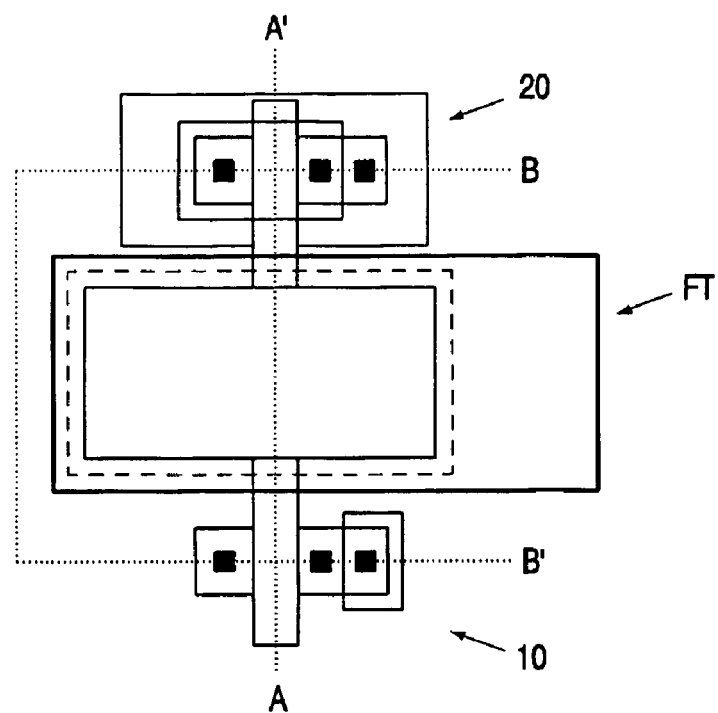
FIG. 3 shows the layout of a cell in a first embodiment of the invention.
Figure 4:
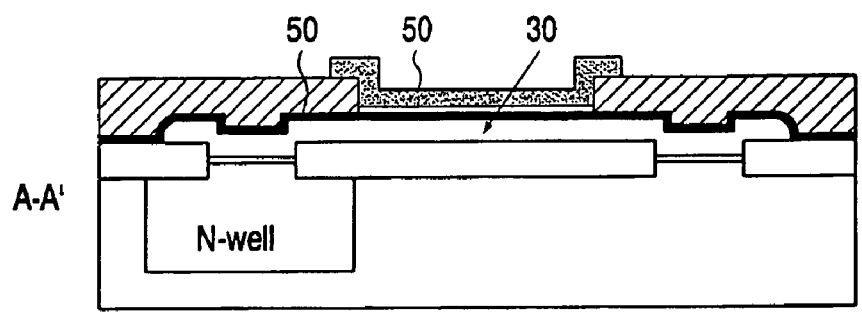
FIG. 4 is a cross section taken along A-A' in FIG. 3.
Figure 5:
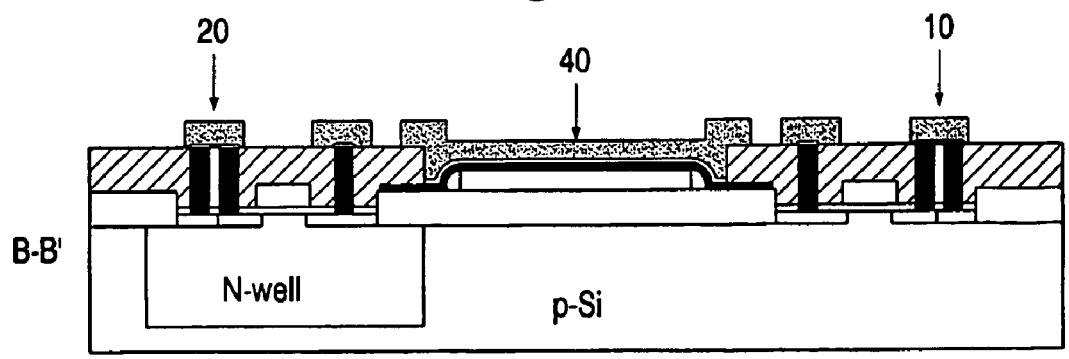
FIG. 5 is a cross section taken along B-B' in FIG. 3.

The layout of a cell according to a first embodiment of the invention is represented in FIG. 3. Cross sections taken along A-A' and B-B' in FIG. 3 are shown in FIG. 4 and FIG. 5, respectively. N-channel transistor 10 and p-channel transistor 20 share a common floating capacitor FT. The floating gate 30 and the gates of n-channel and p-channel transistors 10, 20 are embodied as a polylayer. Floating capacitor FT is completed by a control gate 40 overlying floating gate 30 separated by an oxide or oxide/nitride layer 50.

Figure 6:
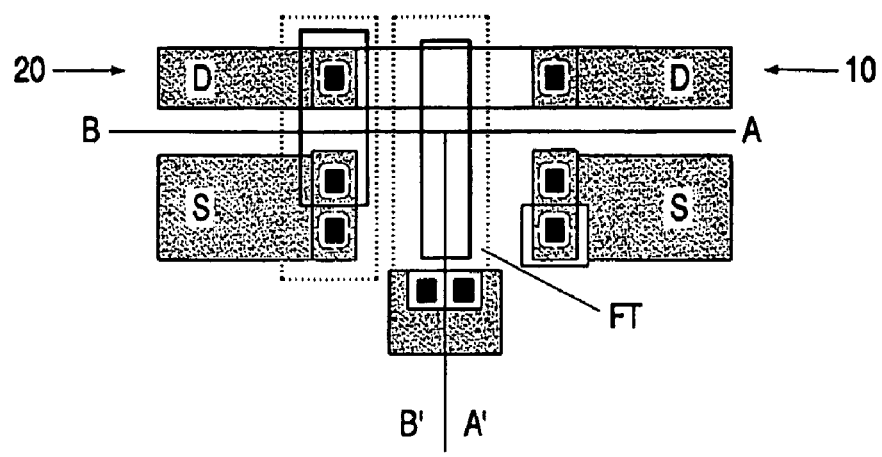
FIG. 6 shows the layout of a cell in a second embodiment of the invention.
Figure 7:
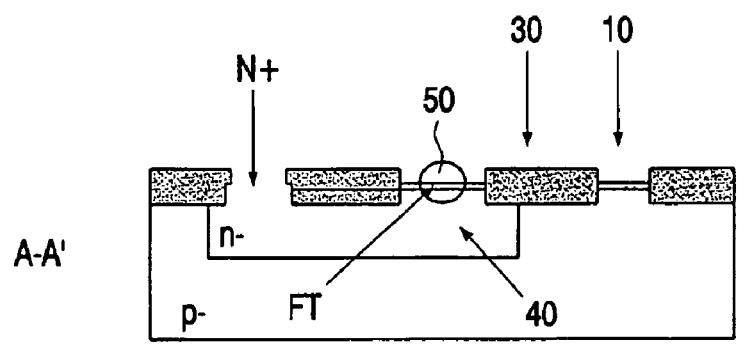
FIG. 7 is a cross section taken along A-A' in FIG. 6.
Figure 8:
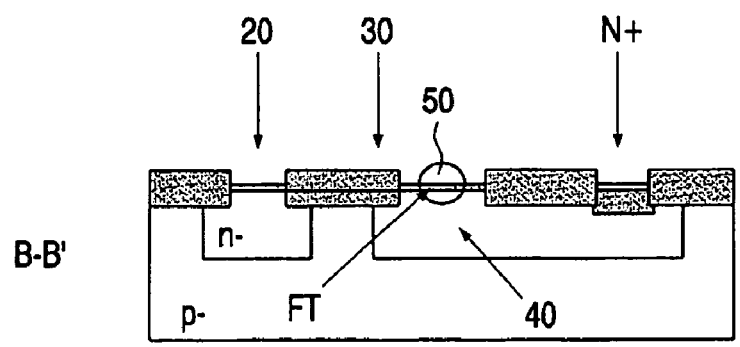
FIG. 8 is a cross section taken along B-B' in FIG. 6.
Figure 9A:
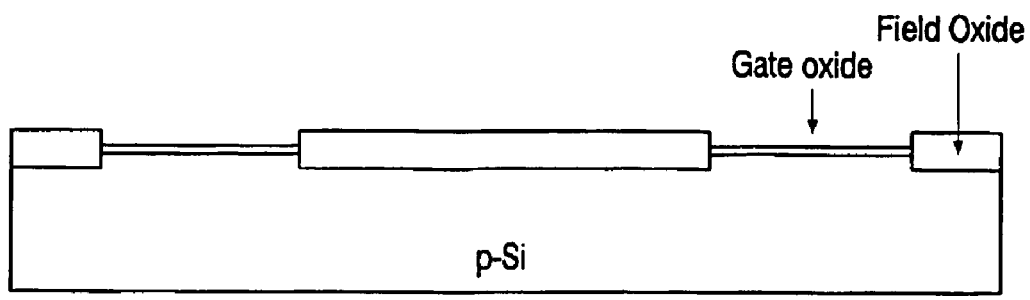
FIG. 9 shows the process steps to build up a cell according to the first embodiment.
Figure 9B:
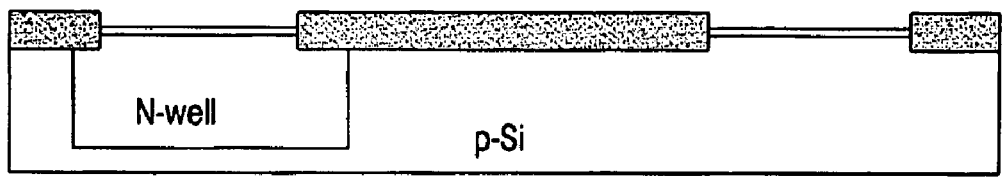
Figure 9C:
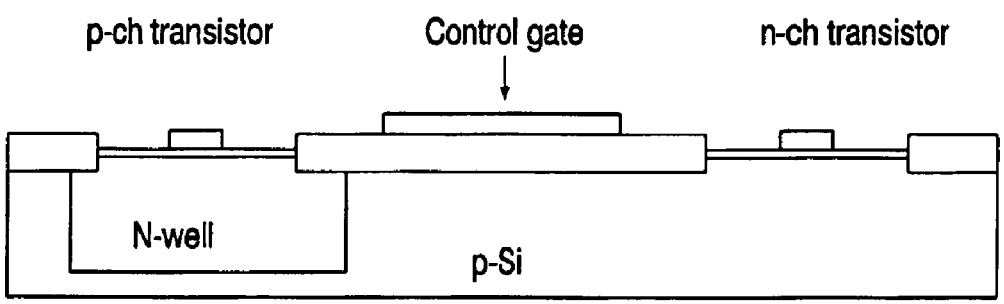
Figure 9D:
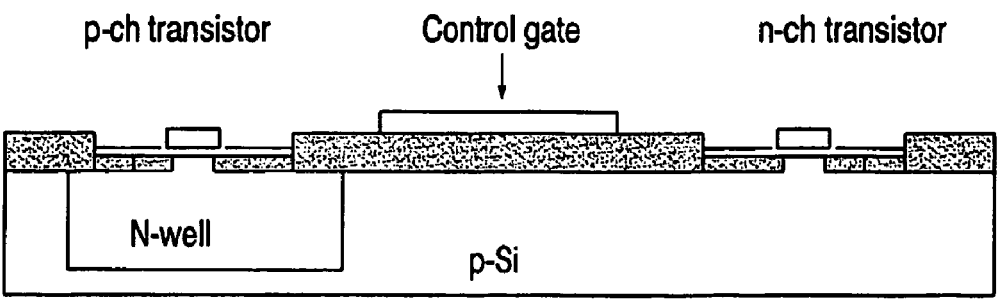
Figure 9E:
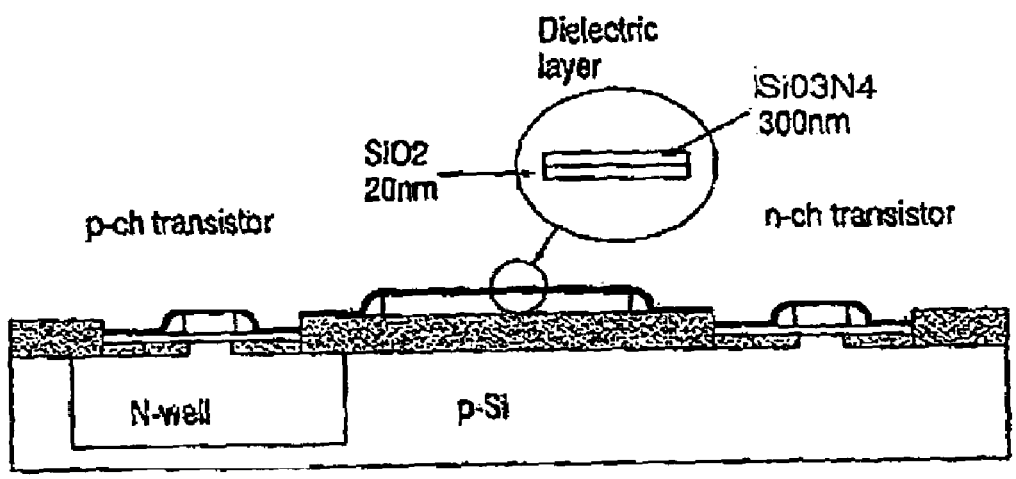
Figure 9F:
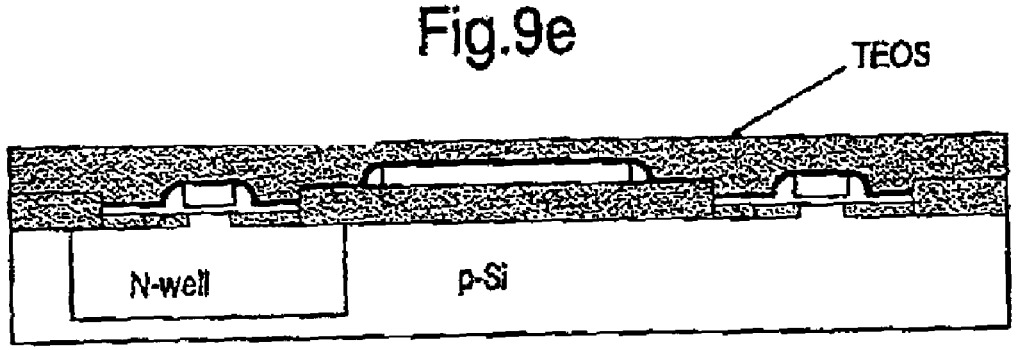
Figure 9G:
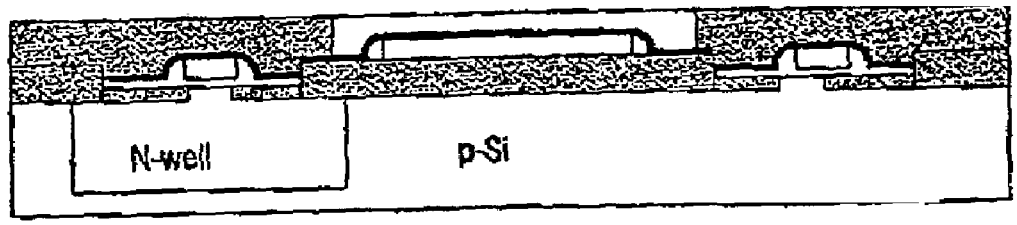
Figure 9H:
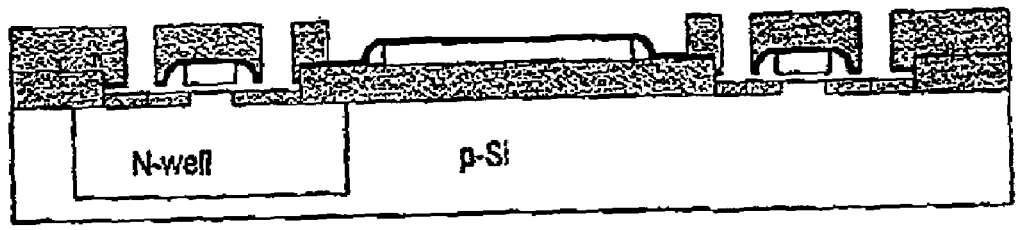
Figure 9I:
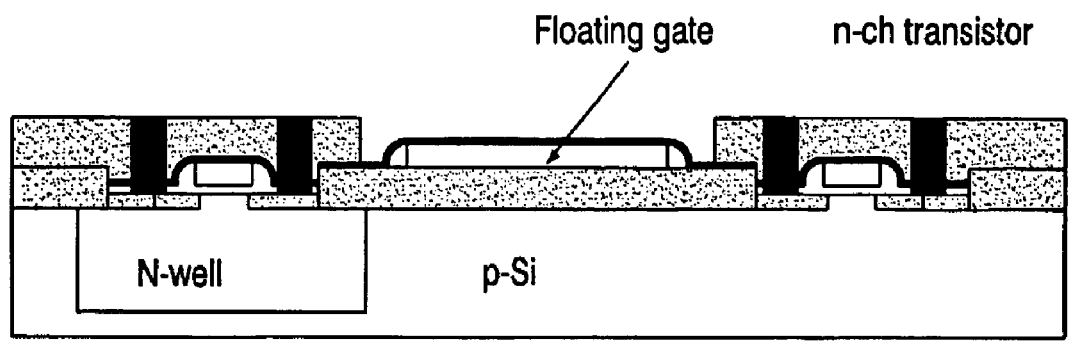
Figure 9J:
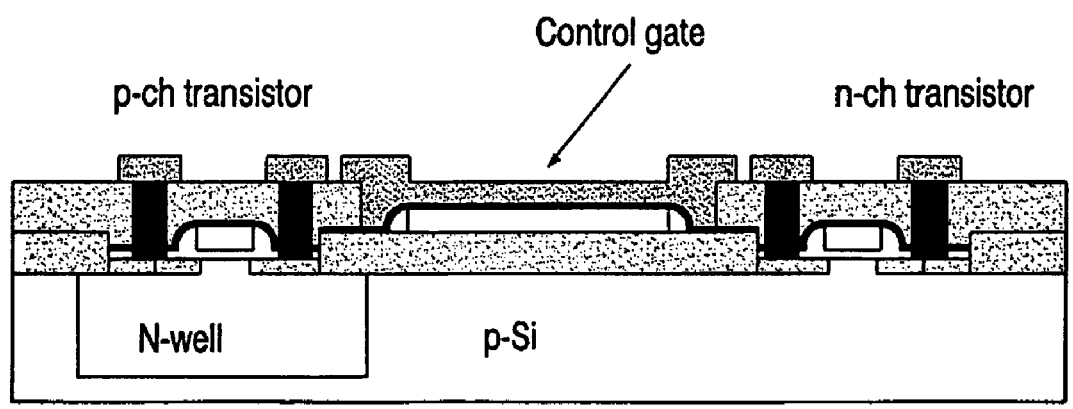

FIG. 6 shows the layout of a cell according to a second embodiment of the invention. In FIGS. 7 and 8, respectively, cross sections taken along A-A' and B-B' are illustrated. In comparison to the embodiment of FIGS. 3 to 5, the n-well diffusion region is extended to used as the control gate 40 separated from the floating gate 30 by an oxide layer 50.

Thus, the implementation of this cell is not restricted to CMOS processes with floating capacitors, but is also applicable for single polylay CMOS processes. No changes in the process flow are necessary. EPROM cells for very low read voltages can be implemented in any CMOS process.

The non-volatile cells according to the invention can also be used to design memory arrays. Here, a select transistor in series with the p-channel transistor has to be included.

FIG. 9 shows an example of a process flow to build up a cell according to the first embodiment of the invention. With a slight modification, it is also possible to use the process flow to build up a cell according to the second embodiment of the invention.

In step (a) a substrate made of p-doped silicon (p-Si) is prepared and subjected to field thermal oxidation to build up an oxide layer on said substrate. Active areas are defined therein which will form gates for the n- and p-transistors.

In step (b), the N-well is implanted under the gate oxide layer which will later be used for the p-channel transistor, and driven in at a temperature of about 1150° C.

In step (c), n$^+$ poly-silicon is deposited on certain areas of the oxide layer to define gate areas of p-channel (p-ch) transistor and n-channel (n-ch) transistor and the control gate.

Thereafter, in step (d) source and drain are formed for n- and p-channel transistors.

In step (e), a dielectric layer comprised of $SiO_2$ in a thickness of 20 nm which is achieved by polyoxidation, and of $SiO_3N_4$ having a thickness of 300 nm, obtained by low pressure CVD deposition is build up on the exposed surface of the structure.

In step (f) oxide in a thickness of 1000 nm is deposited over the dielectric layer, thereafter, the cell is planarized by CMP technology.

In step (g), the opening for the coupling capacitor area is defined by photolithography and then realized by etching the oxide over the desired area.

In a similar process, shown in step (h), the contact holes to sources and drains of the two transistors are provided. Again, photolithography techniques and oxide etching can be used.

In step (i), the contact holes are filled with conducting material.

In step (j), the interconnection is provided by sputtering aluminum/copper (Al/Cu) onto the entire surface, defining contact areas by photolithography and realizing the desired interconnection by etching unnecessary metal portions away.

In a similar manner, the cell of the second embodiment can be realized by providing the N-well region in a suitable manner and by rearranging the interconnections.

The operation of a complementary EPROM cell according to the invention will be explained briefly in the following. An n-channel MOS-transistor is used for programming, and a p-channel MOS is used for reading. Programming is performed by channel hot electron injection. To achieve this, the n-channel MOS-transistor has to be operated in saturation which means a drain voltage $V_d$ in a range between 7.0 to 10.0 V and a control gate voltage $V_{cg}$ in a range of 7.0 to 9.0 V. The optimum condition for programming is given for $V_d$ and $V_{cg}$ that produce a maximum substrate current. Typical reading voltages of $V_d$ for low voltage applications are in the range of 1.5 to 2.5 V.

|  | $V_d$(n-ch) | $V_{cg}$ | $V_d$(p-ch) |
| --- | --- | --- | --- |
| Programming | 7.0 | 8.0 | floating |
| Read | floating | $V_{dd}$ | 1 to 2.5 V |

The invention claimed is:

1. An erasable and programmable non-volatile cell, comprising:
    an n-channel transistor having a source, a drain and a gate;
    a floating capacitor having a floating gate and a control gate, said floating gate being connected to said gate of said n-channel transistor; and
    circuitry for detecting the state, whether erased or programmed, of the cell,
    wherein said circuitry for detecting the state of the cell comprises a p-channel transistor having a source, a drain and a gate, said p-channel transistor being complementary to said n-channel transistor and said gate of said p-channel transistor being connected to said floating gate
    wherein an n-well diffusion region of said p-channel transistor is the control gate of said floating capacitor.

2. The cell of claim 1, wherein the floating gate and the gates of the first and second transistors are embodied as a single polymer layer.

3. The cell of claim 1,
    wherein the n-channel transistor is adapted to program a data value into the cell by having appropriate programming voltages applied to its gate, source and drain, and
    wherein the p-channel transistor is adapted to read the data value from the cell by having appropriate read voltages applied to its gate, source and drain.

4. The cell of claim 3, wherein the drain of the p-channel transistor is adapted to float when the data value is programmed into the cell, and wherein the drain of the n-channel transistor is adapted to float when the data value is read from the cell.

* * * * *